(12) United States Patent
Wang et al.

(10) Patent No.: US 12,040,281 B2
(45) Date of Patent: Jul. 16, 2024

(54) SEMICONDUCTOR PACKAGE STRUCTURE COMPRISING RIGID-FLEXIBLE SUBSTRATE AND MANUFACTURING METHOD THEREOF

(71) Applicant: Taiwan Semiconductor Manufacturing Company, Ltd., Hsinchu (TW)

(72) Inventors: Chuei-Tang Wang, Taichung (TW); Chen-Hua Yu, Hsinchu (TW); Chung-Shi Liu, Hsinchu (TW); Chih-Yuan Chang, Hsinchu (TW); Jiun-Yi Wu, Taoyuan (TW); Jeng-Shien Hsieh, Kaohsiung (TW); Tin-Hao Kuo, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 368 days.

(21) Appl. No.: 17/401,330

(22) Filed: Aug. 13, 2021

(65) Prior Publication Data

US 2021/0375770 A1 Dec. 2, 2021

Related U.S. Application Data

(62) Division of application No. 16/231,622, filed on Dec. 24, 2018, now Pat. No. 11,094,634.

(51) Int. Cl.
| | |
|---|---|
| *H01L 23/495* | (2006.01) |
| *H01L 21/48* | (2006.01) |
| *H01L 21/683* | (2006.01) |
| *H01L 23/00* | (2006.01) |

(Continued)

(52) U.S. Cl.
CPC ...... *H01L 23/5385* (2013.01); *H01L 21/4853* (2013.01); *H01L 21/6835* (2013.01);
(Continued)

(58) Field of Classification Search
CPC ............. H01L 23/5385; H01L 21/4853; H01L 21/6835; H01L 23/3128; H01L 23/5386;
(Continued)

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |

(Continued)

FOREIGN PATENT DOCUMENTS

KR 20110040098 * 4/2011

*Primary Examiner* — Caleb E Henry
*Assistant Examiner* — Dilinh P Nguyen
(74) *Attorney, Agent, or Firm* — JCIPRNET

(57) ABSTRACT

A manufacturing method of a semiconductor package is provided. The method includes: providing an initial rigid-flexible substrate, wherein the initial rigid-flexible substrate includes rigid structures and a flexible core laterally penetrating through the rigid structures, and further includes a supporting frame connected to the rigid structures; bonding a package structure onto the initial rigid-flexible substrate, wherein the package structure includes semiconductor dies and an encapsulant laterally surrounding the semiconductor dies; and removing the supporting frame.

20 Claims, 13 Drawing Sheets

(51) Int. Cl.
  *H01L 23/31* (2006.01)
  *H01L 23/538* (2006.01)
  *H01L 25/065* (2023.01)

(52) U.S. Cl.
  CPC ...... *H01L 23/3128* (2013.01); *H01L 23/5386* (2013.01); *H01L 23/5387* (2013.01); *H01L 24/20* (2013.01); *H01L 24/24* (2013.01); *H01L 24/82* (2013.01); *H01L 25/0655* (2013.01); *H01L 2224/24226* (2013.01); *H01L 2224/82005* (2013.01); *H01L 2924/3511* (2013.01)

(58) Field of Classification Search
  CPC ..... H01L 24/20; H01L 24/24; H01L 25/0655; H01L 2924/3511
  USPC ........................................................ 257/668
  See application file for complete search history.

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2019/0088621 A1* | 3/2019 | Yang .................. H01L 23/5385 |
| 2019/0273030 A1* | 9/2019 | Lim .................... H01L 23/3675 |

* cited by examiner

SEMICONDUCTOR PACKAGE STRUCTURE COMPRISING RIGID-FLEXIBLE SUBSTRATE AND MANUFACTURING METHOD THEREOF

CROSS-REFERENCE TO RELATED APPLICATION

This application is a divisional application of and claims the priority benefit of U.S. patent application Ser. No. 16/231,622, filed on Dec. 24, 2018, now allowed. The entirety of the above-mentioned patent application is hereby incorporated by reference herein and made a part of this specification.

BACKGROUND

Recently, a demand on large scale semiconductor package has grown as development of super high performance computing (super-HPC) techniques. The super-HPC techniques are mainly applied in advanced network and server applications, and also applied in artificial intelligence (AI) related products since requirements of high data rate, large bandwidth and short latency may be fulfilled by the super-HPC techniques. However, along with increasing dimensions of a semiconductor package, a reliability of the semiconductor package at a component level or a board level may be compromised.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
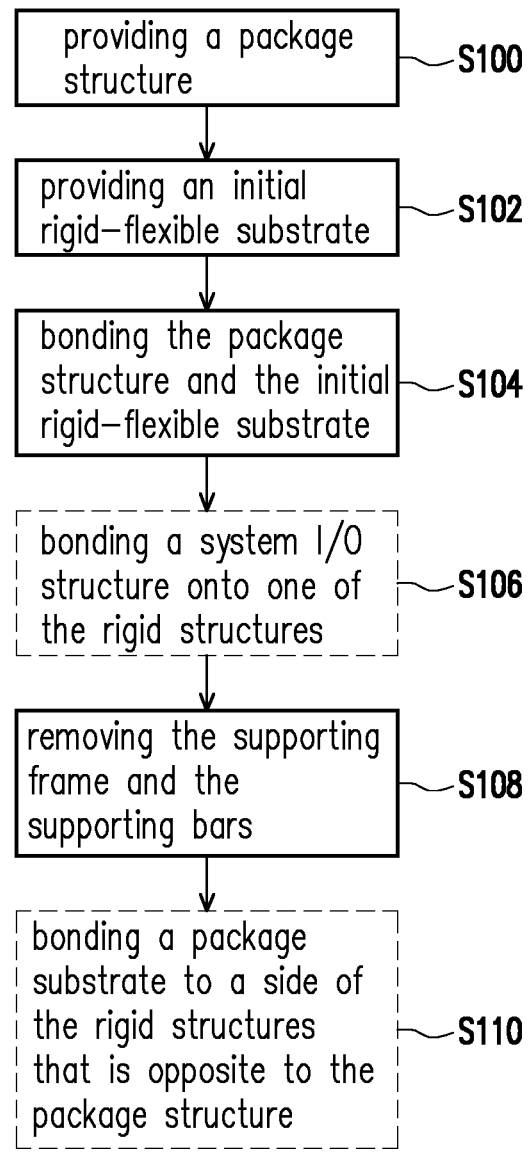
FIG. 1 is a process flow for a manufacturing method of a semiconductor package structure according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be appreciated that the following embodiment(s) of the present disclosure provides applicable concepts that may be embodied in a wide variety of specific contexts. The embodiments are intended to provide further explanations but are not used to limit the scope of the present disclosure.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments will be described with respect to a specific context, namely a semiconductor package structure. Other embodiments may also be applied, however, to other types of package structure. Throughout the various views and illustrative embodiments, like reference numbers are used to designate like elements.

FIG. 1 is a process flow for a manufacturing method of a semiconductor package structure according to some embodiments of the present disclosure. FIG. 2A through FIG. 2F are top and cross-sectional views of structures at various stages of the manufacturing method of the semiconductor package structure shown in FIG. 1.

Figure 2A:
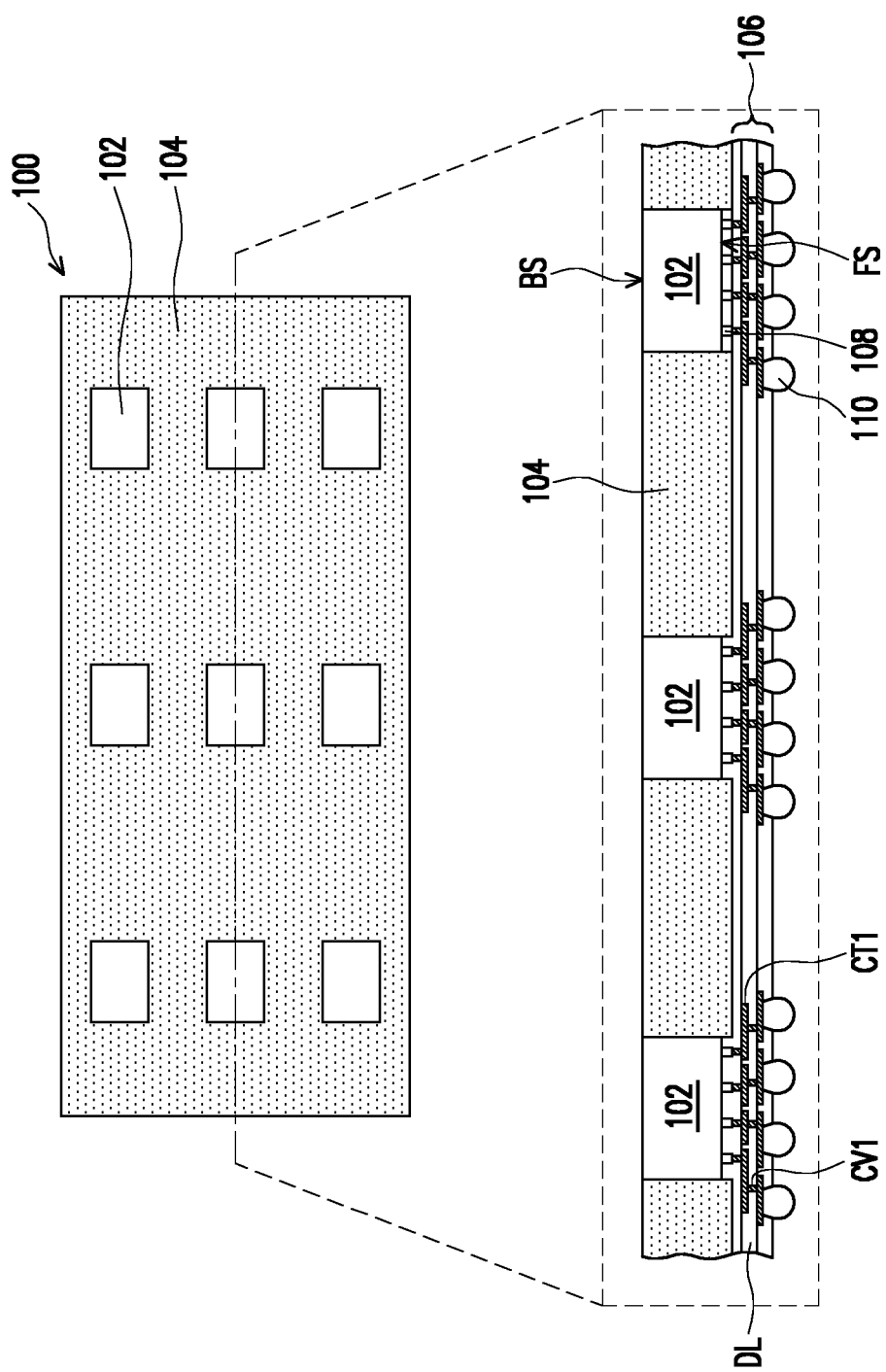
FIG. 2A through FIG. 2F are top and cross-sectional views of structures at various stages of the manufacturing method of the semiconductor package structure shown in FIG. 1.

Referring to FIG. 1 and FIG. 2A, step S100 is performed, and a package structure 100 is provided. The package structure 100 includes a plurality of semiconductor dies 102 and a molding compound 104. In some embodiments, the semiconductor die 102 is a system-on-chip (SOC), application specific integrated circuit (ASIC) chip or the like, but the present disclosure is not limited thereto. The semiconductor dies 102 may be arranged in an array, and have multiple rows and columns. Those skilled in the art may adjust the arrangement of the semiconductor dies 102 according to design requirements, the present disclosure is not limited thereto. In some embodiments, a boundary of the array may be rectangular. In other embodiments, the boundary of the array of semiconductor dies 102 may be circular, polygonal or irregular. In addition, an amount of the semiconductor dies 102 may range from dozens to hundreds. In these embodiments, plenty of semiconductor dies 102 may be packaged together, so as to be compatible with super high performance computing (super-HPC) techniques that are mainly applied in advanced network, server and artificial intelligence (AI) applications. As the cross-sectional view shown in the area enclosed by dotted lines in FIG. 2A, the molding compound 104 laterally encapsulates the semiconductor dies 102. As such, the semiconductor dies 102 are physically connected together by the molding compound 104. A front side FS of the semiconductor die 102 may not covered by the molding compound 104. In some embodiments, a back side BS of the semiconductor die 102 opposite to the front side FS is not covered by the molding compound 104 as well. In alternative embodiments, the back side BS of the semiconductor die 102 is covered by or buried in the molding compound 104.

In some embodiments, the package structure 100 further includes a redistribution layer 106. The redistribution layer 106 is formed on the front side FS of the semiconductor dies 102, and covers a surface of the molding compound 104 (e.g., a bottom surface of the molding compound 104 as shown in FIG. 2A). A circuit in the redistribution layer 106 is electrically connected with the semiconductor dies 102. In some embodiments, the circuit of the redistribution layer 106 is electrically connected to the semiconductor dies 102 via conductive connectors 108 formed on the front side FS of the semiconductor dies 102. The conductive connectors 108 may be regarded as I/Os of the corresponding semiconductor die 102. For instance, the conductive connector 108 may be a conductive pad, a conductive post or a combination thereof. In some embodiments, the redistribution layer 106 includes a stack of dielectric layers DL. The circuit may be formed in the stack of dielectric layers DL. In some embodiments, the circuit of the redistribution layer 106 includes conductive vias CV1 and conductive traces CT1. The conductive via CV1 vertically penetrates one of the dielectric layers DL, to provide a vertical signal path. On the other hand, the conductive trace CT1 lies over one of the dielectric layers DL, to provide a horizontal signal path. By disposing the redistribution layer 106, the I/Os of the semiconductor die 102 (e.g., the conductive connectors 108) may be routed out to a wider area, and the package structure 100 may be referred as an integrated fan-out (InFO) package structure.

In some embodiments, a plurality of electrical connectors 110 are formed at a surface of the redistribution layer 106 that is opposite to the semiconductor dies 102. In some embodiments, the electrical connectors 110 are electrically connected to the out-routed I/Os of the semiconductor dies 102. For instance, the electrical connector 110 may be a solder ball, a bump (e.g., a controlled collapse chip connection (C4) bump), a conductive pillar (e.g., a copper pillar) or the like. Since the electrical connectors 110 is connected to the out-routed I/Os of the semiconductor dies 102, an interval between laterally adjacent electrical connectors 110 may be greater than an interval between laterally adjacent conductive connectors 108 formed on the semiconductor dies 102.

Figure 2B:
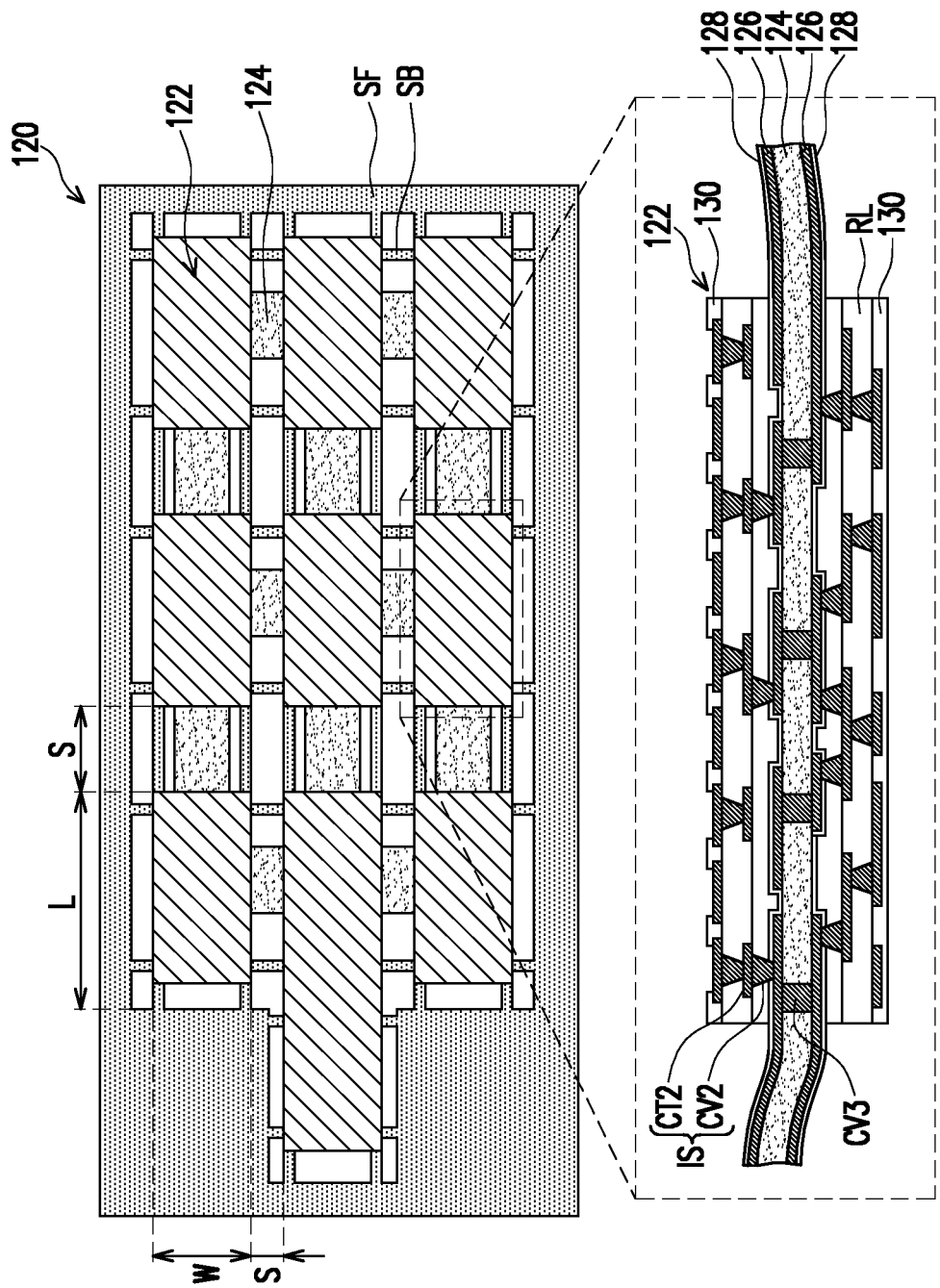

Referring to FIG. 1 and FIG. 2B, step S102 is performed, and an initial rigid-flexible substrate 120 is provided. The initial rigid-flexible substrate 120 includes a plurality of rigid structures 122 and a flexible core 124. In some embodiments, the rigid structures 122 are arranged in an array, and the flexible core 124 is formed in a mesh pattern. The rigid structures 122 are configured to be respectively bonded with the semiconductor dies 102 of the package structure 100 in the following steps. In some embodiments, an amount of the rigid structures 122 may be equal to the amount of the semiconductor dies 102. In alternative embodiments, the amount of the rigid structures 122 may be less than or greater than the amount of the semiconductor dies 102. In some embodiments, some of the rigid structures 122 may be larger than the others. For instance, the leftmost one in the second row of the rigid structures 122 shown in FIG. 2B has a greater top view area than the others. The relatively large rigid structure(s) 122 may be configured to be attached to additional device, such as a system I/O (e.g., the system I/O structure 140 shown in FIG. 2E). In some embodiments, a width W and a length L of each rigid structure 122 may respectively range from 20 mm to 300 mm. A spacing S between laterally adjacent rigid structures 122 may range from 1 mm to 300 mm.

As the cross-sectional view shown in the area enclosed by dotted line in FIG. 2B, in some embodiments, the flexible core 124 is a flexible thin layer. The flexible core 124 laterally penetrates the rigid structures 122, and connects the rigid structures 122 together. The flexible core 124 is made of a flexible material, and the rigid structure 122 includes a plurality of rigid layers RL. As such, a portion of the initial rigid-flexible substrate 120 is flexible, and another portion of the initial rigid-flexible substrate 120 is rigid. In other words, the initial rigid-flexible substrate 120 is semi-flexible or semi-rigid. For instance, the flexible material includes a polymer such as polyimide. In addition, a material of the rigid layer RL includes glass fiber material (e.g., flame retardant 4, FR4), resin or the like. In some embodiments, a formation method of the rigid layers RL includes performing a punch, pressing or lamination process to form layers over the whole flexible core 124, and includes performing a patterning process to remove portions of these layers, so as to form the discontinuous rigid layers RL on the flexible core 124. In some embodiments, the rigid layers RL are stacked in the rigid structure 122. An amount of the rigid layers RL in the rigid structure 122 may range from 2 to 10, but the present disclosure is not limited thereto. In some embodiments, amounts of the rigid layers RL formed at opposite sides of the flexible core 124 are equal. In alternative embodiments, amounts of the rigid layers RL formed at opposite sides of the flexible core 124 are different.

The rigid structure 122 further includes an interconnection structure IS. The interconnection structure IS is configured to electrically connect with the redistribution layer 106 of the package structure 100 when the package structure 100 and the initial rigid-flexible substrate 120 are bonded together in the following steps. The interconnection structure IS is located in the rigid layers RL. In some embodiments, the flexible core 124 in the rigid structure 122 is located between vertically adjacent portions of the interconnection structure IS in the same rigid structure 122. In some embodiments, the interconnection structure IS includes conductive vias CV2 and conductive traces CT2. The conductive via CV2 vertically penetrates one of the rigid layers RL, to provide a vertical signal path. On the other hand, the conductive trace CT2 lies over one of the rigid layers RL, to provide a horizontal signal path. In some embodiments, a material of the conductive vias CV2 and the conductive traces CT2 includes Cu, Al, the like or combinations thereof. In some embodiments, a formation method of the interconnection structures IS includes forming openings in the rigid layers RL, and includes forming conductive materials in the openings and over the rigid layers RL by, for example, a plating process.

A circuit layer 126 is formed over a surface of the flexible core 124. The circuit layer 126 is extended along the flexible core 124. As such, some portions of the circuit layer 126 are located within rigid structures 122, and the other portions of the circuit layer 126 are located outside the rigid structures 122 (e.g., between laterally adjacent rigid structures 122). The circuit layer 126 is electrically connected with the interconnection structures IS. In other words, the interconnection structures IS of different rigid structures 102 may be electrically connected via the circuit layer 126. In some embodiments, a protection layer 128 is formed over the circuit layer 126, so as to protect the circuit layer 126 from oxidation. It should be noted that the circuit layer 126 and the protection layer 128 are omitted in the top view shown in FIG. 2B. In some embodiments, the flexible core 124 is a flexible thin layer, and the circuit layer 126 may be formed at opposite sides of the flexible thin layer. In these embodiments, conductive vias CV3 are formed to vertically penetrate the flexible core 124, and electrically connect between portions of the circuit layer 126 at opposite sides of the flexible core 124. As such, portions of the interconnection structure IS at opposite sides of the flexible core 124 may be electrically connected via the circuit layer 126 and the conductive vias CV3.

In some embodiments, passivation layers 130 are formed on opposite sides of the rigid structures 122. For instance, the passivation layers 130 may be formed on a top surface and a bottom surface of the rigid structures 122 as shown in FIG. 2B. In some embodiments, a material of the passivation layer 130 may include silicon nitride, silicon oxide, the like or combinations thereof. The passivation layer 130 formed on the top surface of the rigid structures 122 may be patterned to have a plurality of openings. These openings expose the underlying interconnection structures IS. In addition, locations of these openings are corresponding to locations of the electrical connectors 110 disposed on the package structure 100. As such, the electrical connectors 110 may be disposed in the openings of the passivation layer 130 when the package structure 100 and the initial rigid-flexible substrate 120 are bonded together in the following steps. In some embodiments, the passivation layer 130 on the bottom surface of the rigid structures 122 may be patterned to have openings for other electrical connectors (e.g., the electrical connectors 152 as shown in FIG. 2F). In other embodiments, the passivation 130 on the bottom surface of the rigid structures 122 may be remained unpatterned. In some embodiments, under bump metallurgic layers (not shown) are formed in these openings, so as to be electrically connected between the electrical connectors 110 and the interconnection structures IS in the rigid structures 122. In alternative embodiments, the electrical connectors 110 may be formed in the openings of the passivation layer 130 on the top surface of the rigid structures 122, rather than being formed on the bottom surface of the package structure 100.

In some embodiments, the initial rigid-flexible substrate 120 further includes a supporting frame SF. The supporting frame SF surrounds the rigid structures 122, and physically connects to the rigid structures 122 via a plurality of supporting bars SB. In some embodiments, some of the supporting bars SB are physically connected between laterally adjacent rigid structures 122. In addition, an air gap may exist between adjacent supporting bars SB. A material of the supporting frame SF and supporting bars SB may include glass fiber material (e.g., flame retardant 4, FR4), resin or the like. In some embodiments, the rigid layers RL, the supporting frame SF and the supporting bars SB are made of the same material. In other embodiments, the material of the rigid layers RL is different from the material of the supporting frame SF and the supporting bars SB.

Figure 2C:
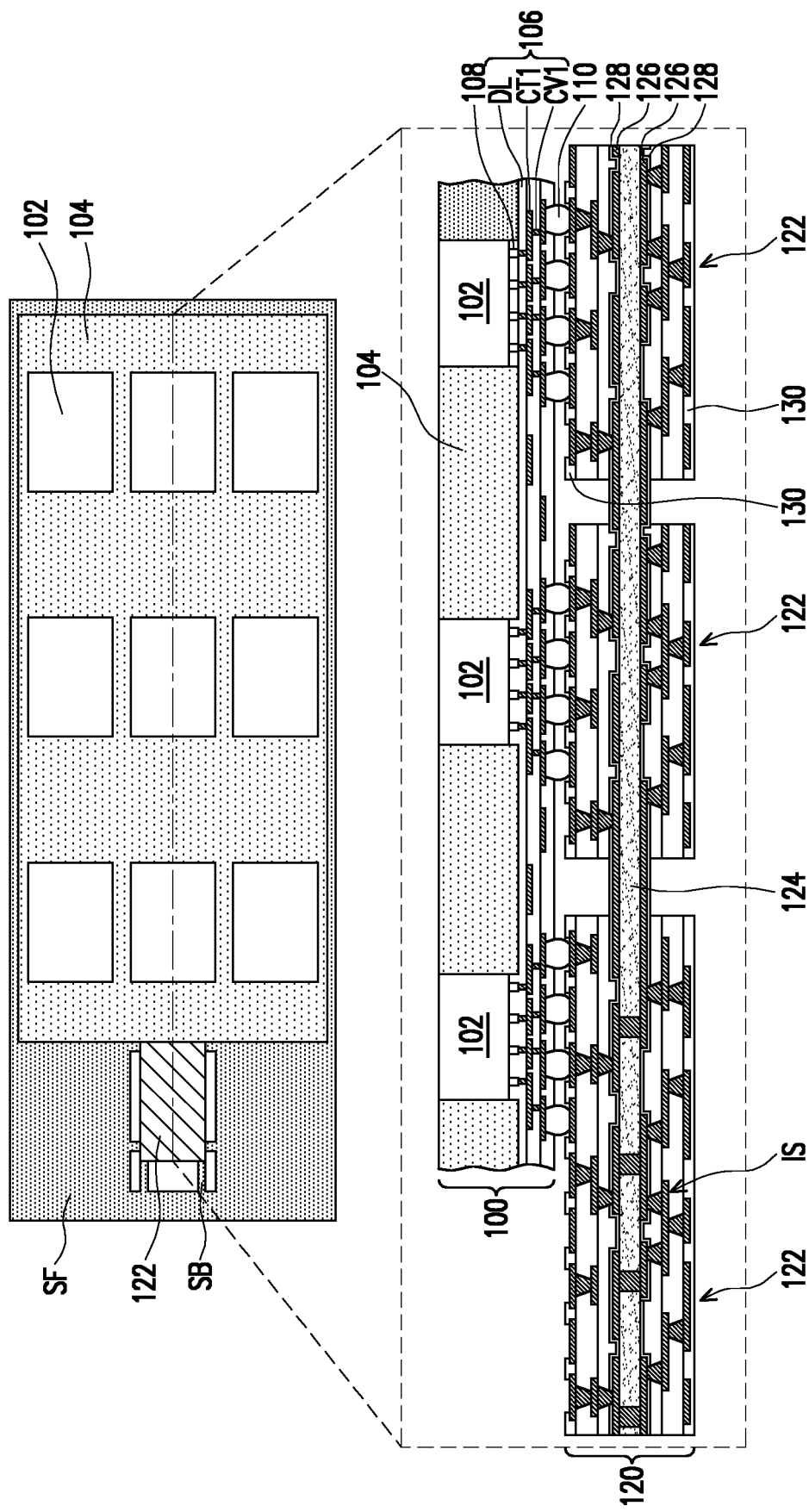

Referring to FIG. 1 and FIG. 2C, step S104 is performed, and the package structure 100 and the initial rigid-flexible substrate 120 are bonded together. The initial rigid-flexible substrate 120 is disposed at a side of the redistribution layer 106 opposite to the semiconductor dies 102. An extension direction of the flexible core 124 is substantially parallel with the surface of the redistribution layer 106 that is facing the initial rigid-flexible substrate 120. Locations of the rigid structures 122 of the initial rigid-flexible substrate 120 are in correspondence to locations of the semiconductor dies 102 of the package structure 100. The interconnection structures IS in the rigid structures 122 are electrically connected to the semiconductor dies 102 via the redistribution layer 106 and the electrical connectors 110. In some embodiments, the electrical connectors 110 are disposed between the redistribution layer 106 and the rigid structures 122, and electrically connected between the redistribution layer 106 and the interconnection structures IS in the rigid structures 122. In addition, in some embodiments, the electrical connectors 110 are located in the openings of the passivation layer 130 disposed at the top surface of the rigid structures 122. Furthermore, in some embodiments, the rigid structures 122 are not completely covered by the package structure 100. For instance, some rigid structure(s) 122 having relatively large area (e.g., the leftmost in the second row of the rigid structures 122 as shown in FIG. 2C) is partially covered by the package structure 100, whereas the other rigid structures 122 are completely covered by the package structure 100.

Figure 2D:
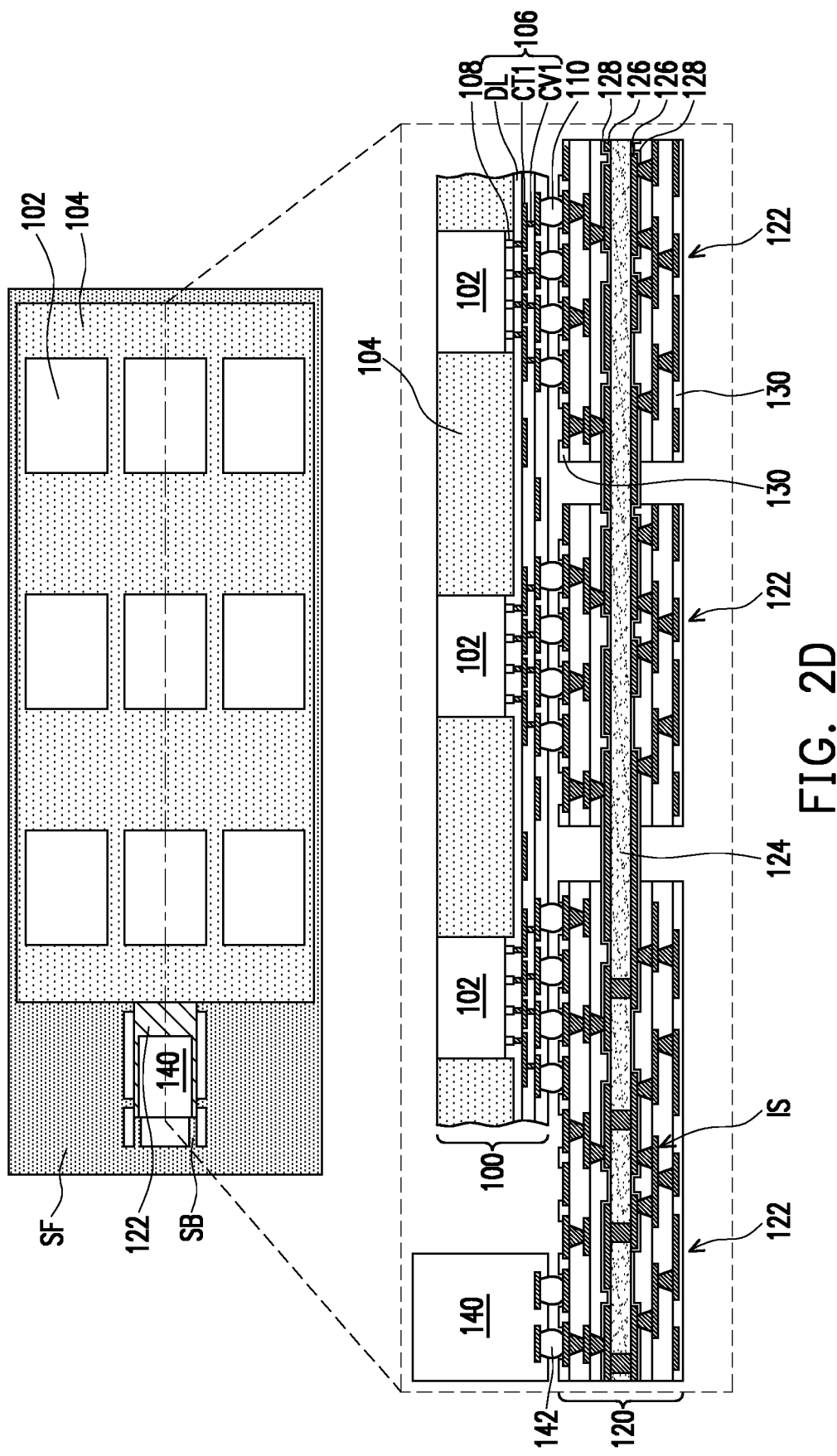

Referring to FIG. 1 and FIG. 2D, step S106 is optionally performed, and a system I/O structure 140 is bonded onto one of the rigid structures 122. In addition, the system I/O structure 140 and one of the semiconductor die 102 are overlapped with the same rigid structure 122. For instance, the system I/O structure 140 is bonded onto the rigid structure 122 having larger area than the others (e.g., the leftmost in the second row of the rigid structures 122 as shown in FIG. 2D), and is located aside the package structure 100. The system I/O structure 140 is electrically connected with the interconnection structures IS of the rigid structures 122, and the interconnection structures IS are electrically connected with the semiconductor dies 102 via the electrical connectors 110 and the redistribution layer 106. As such, signal may be transmitted between the system I/O structure 140 and the semiconductor dies 102. In some embodiments, the system I/O structure 140 is electrically connected with the interconnection structure IS of the corresponding rigid structure 122 through electrical connectors 142. The electrical connectors 142 are formed at the bottom surface of the system I/O structure 140 that is facing the rigid structure 122, and may be located in the openings of the passivation layer 130 on the top surface of the rigid structure 122 when the system I/O structure 140 is bonded onto the rigid structure 122. In some embodiments, the electrical connector 142 may be a solder ball, a bump (e.g., a C4 bump), a conductive pillar (e.g., a copper pillar) or the like.

Figure 2E:
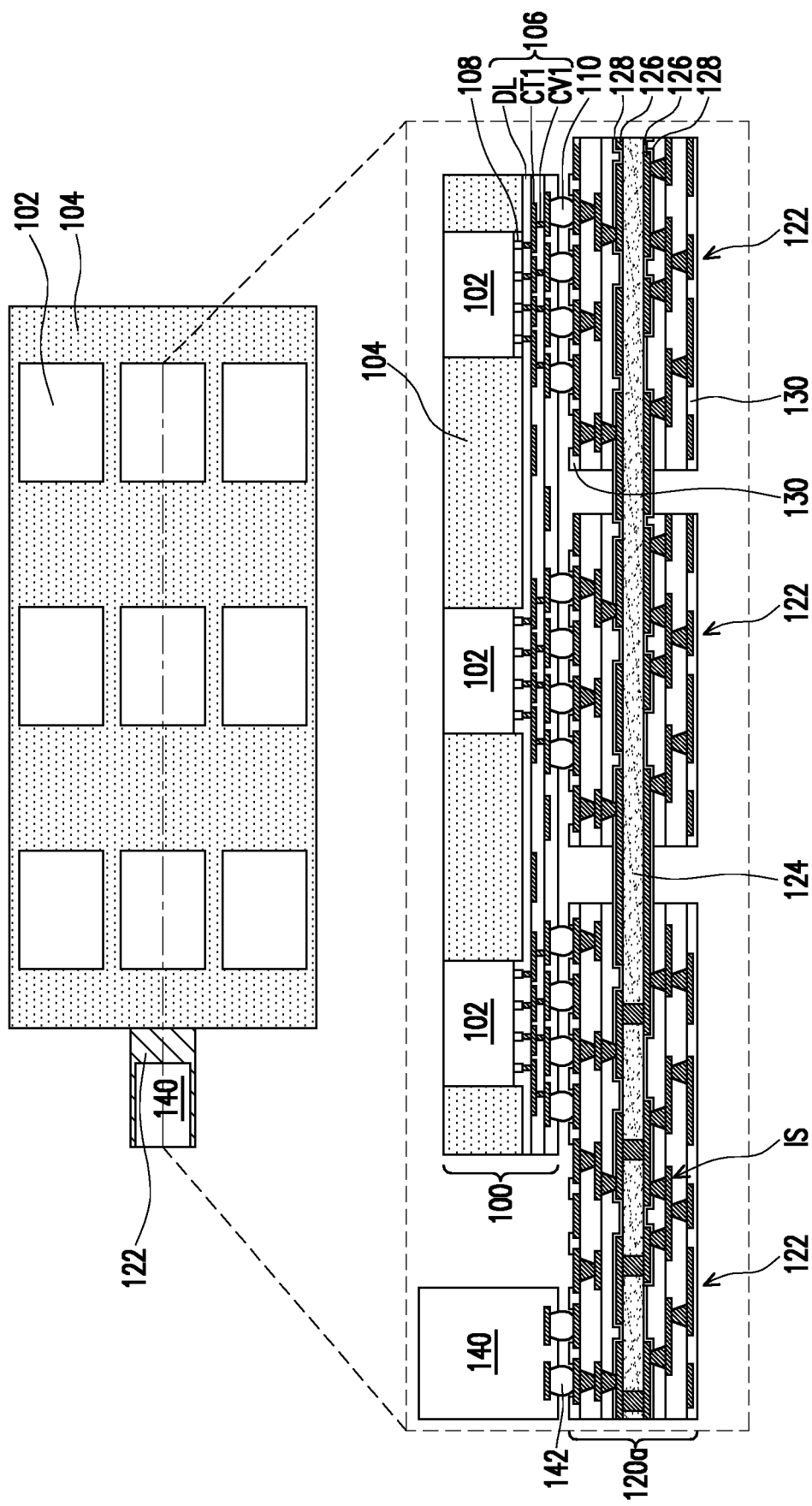
Figure 2F:
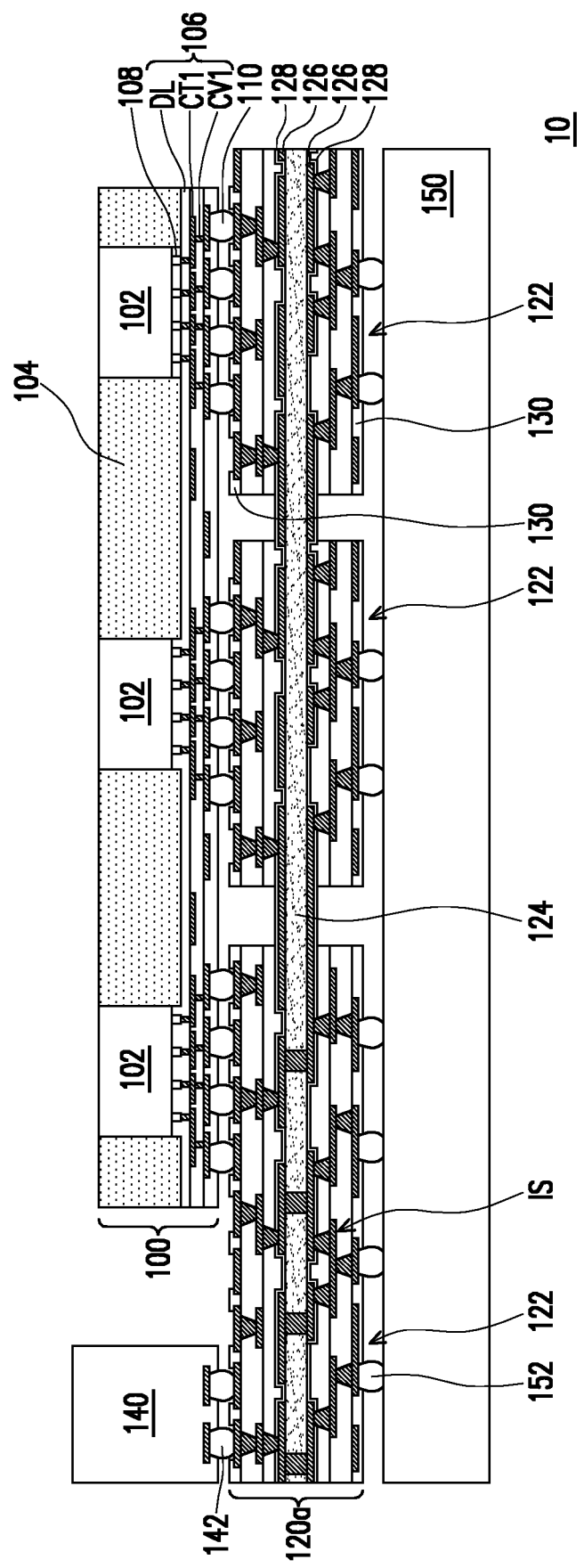

Referring to FIG. 1 and FIGS. 2D and 2E, step S108 is performed, and the supporting frame SF and the supporting bars SB are removed. The remaining portion of the initial rigid-flexible substrate 120 (i.e., the rigid structures 122 and the flexible core 124) is referred as a rigid-flexible substrate 120a. In some embodiments, a method for removing the supporting frame SF and the supporting bars SB includes laser cutting, mechanical cutting or the like.

Referring to FIG. 1 and FIG. 2F, step S110 is optionally performed, and a package substrate 150 is bonded to a side of the rigid structures 122 that is opposite to the package structure 100. The system I/O structure 140 over the package substrate 150 is located aside the package structure 100. In some embodiments, the package substrate 150 is a printed circuit board (PCB). In addition, in some embodiments, electrical connectors 152 are connected between the interconnection structures IS of the rigid structures 122 and the package substrate 150. In these embodiments, the passivation layer 130 at the bottom surface of the rigid structures 122 opposite to the package structure 100 is patterned to have a plurality of openings. Interconnection structures IS in the rigid structures 122 are exposed by these openings, and the electrical connectors 152 are formed in these openings. In some embodiments, the electrical connector 152 may be a solder ball, a bump (e.g., a C4 bump), a conductive pillar (e.g., a copper pillar) or the like. So far, the manufacture of the semiconductor package structure 10 according to some embodiments is completed.

As above, the rigid-flexible substrate 120a is partially in contact with the package structure 100. Specifically, the rigid structures 122 are separately in contact with the package structure 100, whereas sections of the flexible core 124 connected between laterally adjacent rigid structures 122 are not in physical contact with the package structure 100. As compared to a substrate completely in contact with the package structure 100, each rigid structure 122 of the present disclosure can have a shorter maximum distance to neutral point (DNP). Accordingly, maximum strain on the electrical connector 110 located on the rigid structures 122 may be reduced. In addition, the strain on the rigid structures 122 induced by, for example, coefficient of thermal expansion (CTE) difference between the package structure 100 and the rigid structures 122 may be released at the vicinity between laterally adjacent rigid structures 122. Therefore, reliability of the semiconductor package structure 10 may be improved, and this improvement is particularly significant when the package structure 100 contains plenty of semiconductor dies 102 as for super-HPC applications.

Figure 3:
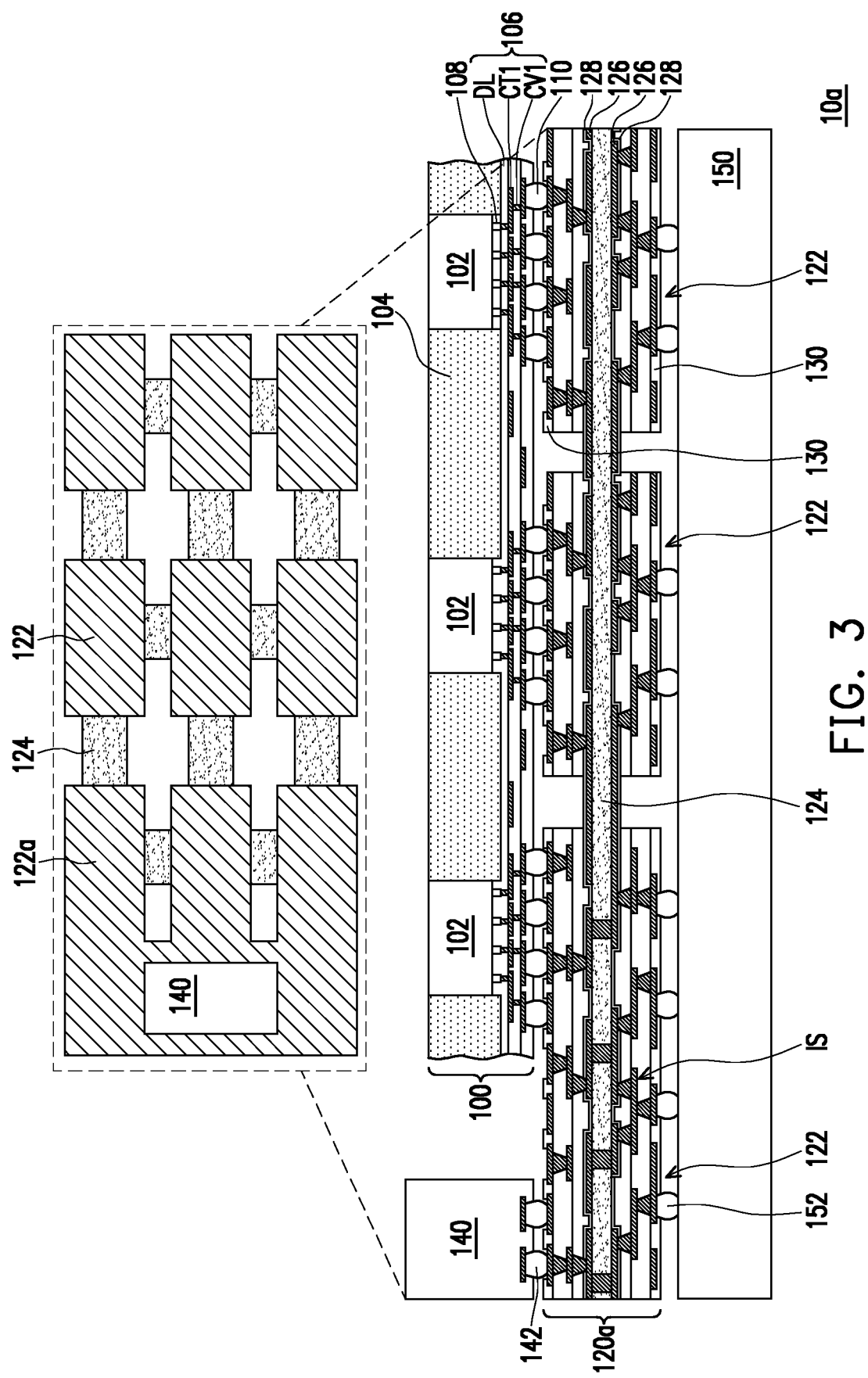
FIG. 3 through FIG. 5 are cross-sectional views of semiconductor package structures according to some embodiments of the present disclosure.

FIG. 3 is a cross-sectional view of a semiconductor package structure 10a according to some embodiments of the present disclosure.

Referring to FIG. 2F and FIG. 3, the semiconductor package structure 10a shown in FIG. 3 is similar to the semiconductor package structure 10 shown in FIG. 2F. Only the difference therebetween will be discussed, the same or similar parts will be omitted for clarity. As shown in the area enclosed by dotted line in FIG. 3, some of the rigid structures 122 are extended to be physically connected with each other, whereas the others are separated from one another. In some embodiments, some of the outermost rigid structures 122 are connected together. For instance, when the rigid structures 122 are arranged in an array, an outermost column of rigid structures 122 are connected to form an interconnected rigid structure 122a. In some embodiments, the rigid structures 122 are extended along a row direction and a column direction, and the interconnected rigid structure 122a is substantially formed in a comb shape. The system I/O structure 140 may be bonded onto a shaft part of the comb shape interconnected rigid structure 122a. Since an area of the interconnected rigid structure 122a is greater than an area of any individual rigid structure 122, the interconnected rigid structure 122a may have a larger available space for the system I/O structure 140. In some embodiments, a larger system I/O structure 140 (as compared to the system I/O structure 140 shown in FIG. 2F) may be bonded onto the interconnected rigid structure 122a. However, those skilled in the art would adjust the location, dimension and/or pattern of the interconnected rigid structure 122a, the present disclosure is not limited thereto.

Figure 4:
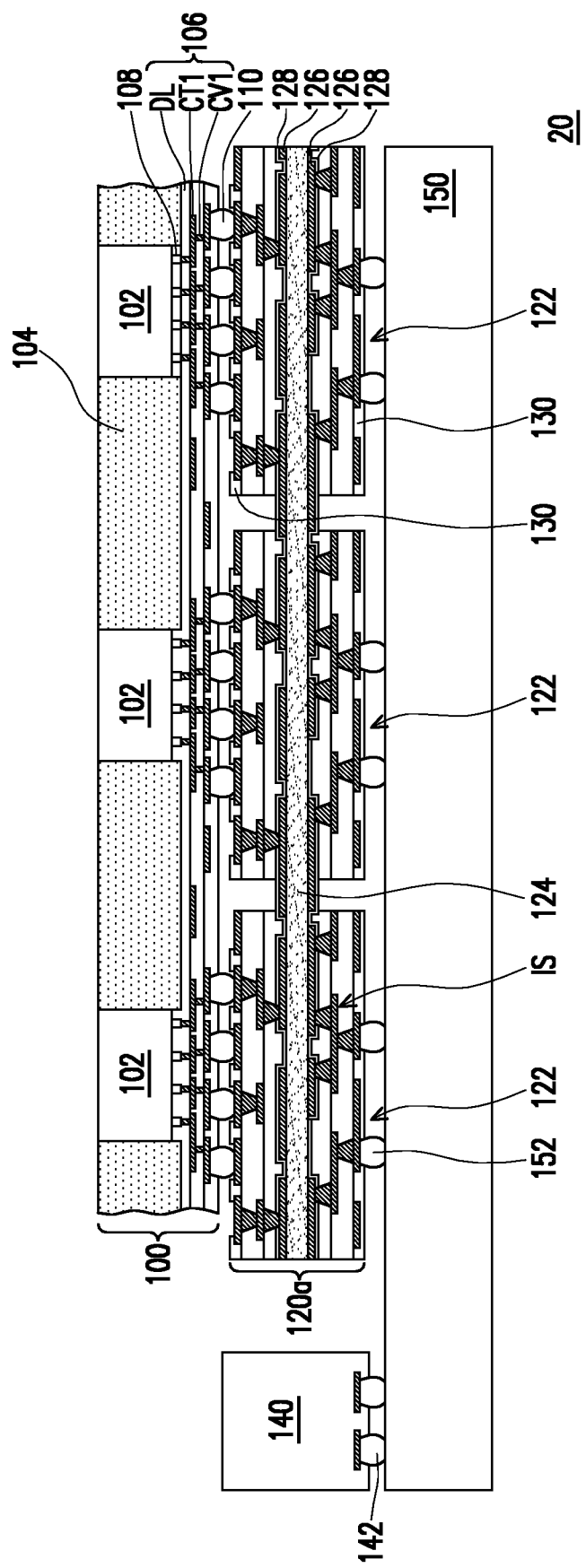

FIG. 4 is a cross-sectional view of a semiconductor package structure 20 according to some embodiments of the present disclosure.

Referring to FIG. 2F and FIG. 4, the semiconductor package structure 20 shown in FIG. 4 is similar to the semiconductor package structure 10 shown in FIG. 2F. Only the difference therebetween will be discussed, the same or similar parts will be omitted for clarity. As shown in FIG. 4, in some embodiments, the system I/O structure 140 is bonded on the package substrate 150 aside a stacking structure including the rigid-flexible substrate 120a and the package structure 100. In these embodiments, since the system I/O structure 140 is not bonded onto one of the rigid structures 122, it is not necessary to have some of the rigid structure(s) 122 larger than the others. In addition, signals are transmitted between the semiconductor dies 102 and the system I/O structure 140 through the package substrate 150 and the rigid structures 122.

Figure 5:
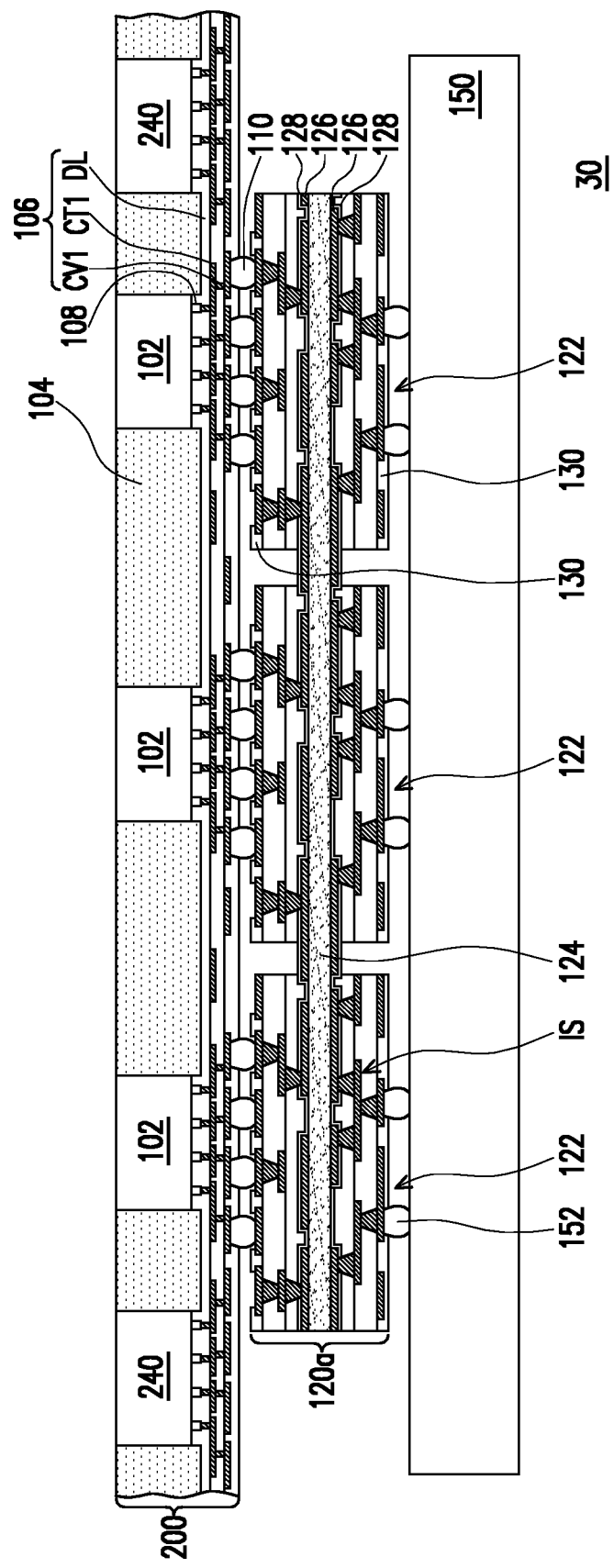

FIG. 5 is a cross-sectional view of a semiconductor package structure 30 according to some embodiments of the present disclosure.

Referring to FIG. 4 and FIG. 5, the semiconductor package structure 30 shown in FIG. 5 is similar to the semiconductor package structure 20 shown in FIG. 4. Only the difference therebetween will be discussed, the same or similar parts will be omitted for clarity. In addition, the same or like numeral references indicate the same or similar elements. As shown in FIG. 5, at least one system I/O structure 240 is embedded in a package structure 200, rather than being bonded onto the rigid-flexible substrate 120a or the package substrate 150. In some embodiments, an amount of the system I/O structure 240 is plural, but the present disclosure is not limited thereto. The system I/O structures 240 are laterally encapsulated by the molding compound 104 with the semiconductor dies 102. In some embodiments, the system I/O structures 240 are located in a peripheral region of the package structure 200, whereas the semiconductor dies 102 are located in a central region of the package structure 200. The redistribution layer 106 covers a front surface of the system I/O structures 240 and a front surface of the semiconductor dies 102. The circuit in the redistribution layer 106 is electrically connected with the system I/O structures 240 and the semiconductor dies 102. In other words, signals transmitted between the system I/O structures 240 and the semiconductor dies 102 may travel through the redistribution layer 106, and may not travel through the rigid structures 122 and the package substrate 150. As such, a travel distance for the signals is shorten, and insertion loss and return loss due to multiple connecting interface (e.g., the interface between electrical connectors 110 and the interconnection structures IS of the rigid structures 122) may be reduced.

In some embodiments, the system I/O structure 240 is an optical interface (OI) socket, on which an optical module (not shown) may be plugged. A back surface of the system I/O structure 240 may not be covered by the molding compound 104 (i.e., exposed by the molding compound 104), such that the optical module may be plugged onto the back surface of the system I/O structure 240.

Figure 6:
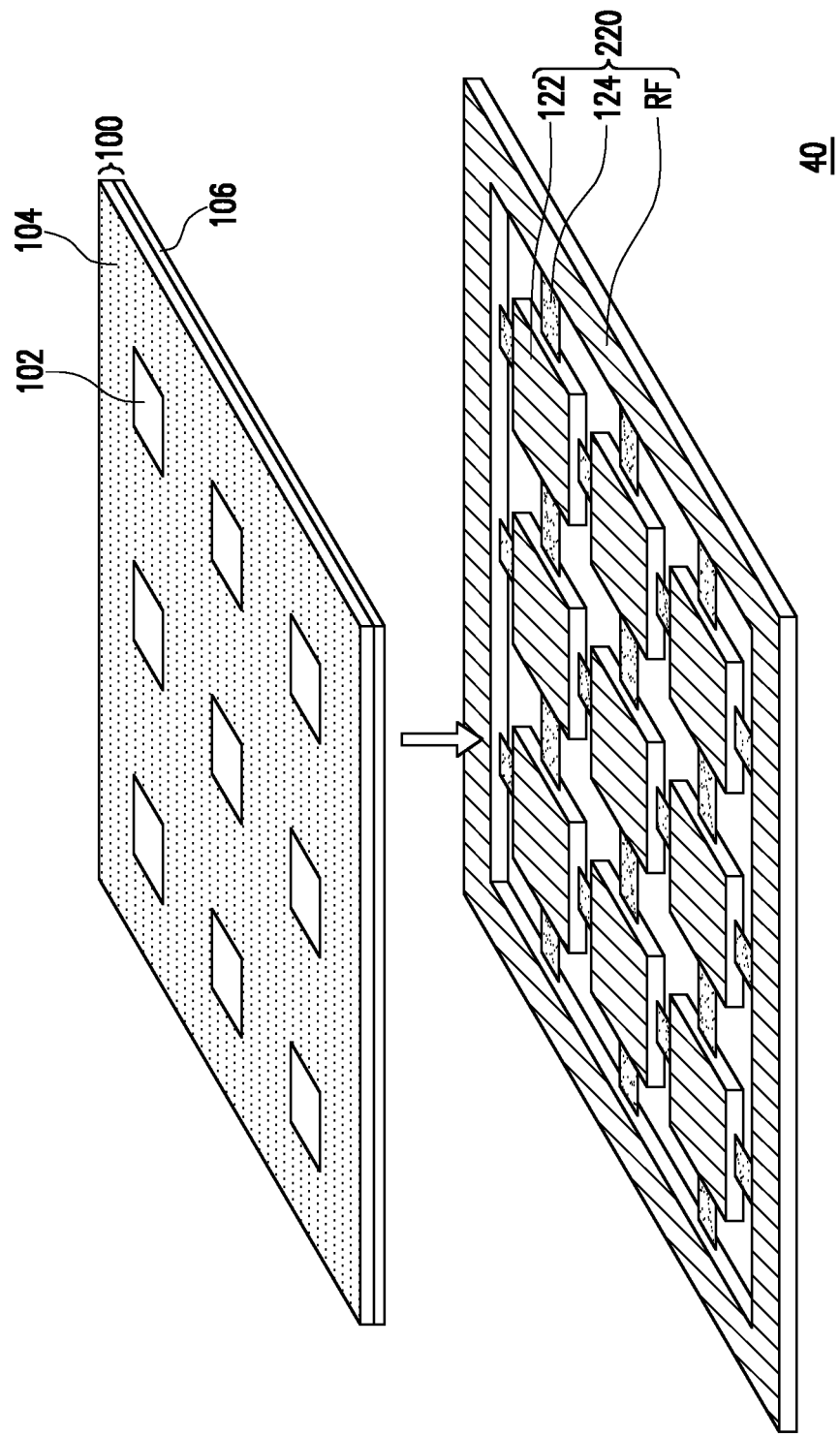
FIG. 6 is a three dimensional view of a semiconductor package structure according to some embodiments of the present disclosure.

FIG. 6 is a three dimensional view of a semiconductor package structure 40 according to some embodiments of the present disclosure.

Referring to FIG. 2F and FIG. 6, the semiconductor package structure 40 shown in FIG. 6 is similar to the semiconductor package structure 10 shown in FIG. 2F. Only the difference therebetween will be discussed, the same or similar parts will be omitted for clarity. In addition, it should be note that some elements including the electrical connectors 110, the circuit layer 126, the protection layer 128 and the passivation layer 130 are omitted in FIG. 6. As shown in FIG. 6, a rigid-flexible substrate 220 further includes a rigid frame RF. The rigid frame RF surrounds the rigid structures 122. The flexible core 124 connecting the rigid structure 122 further extends outwardly, so as to be connected with the rigid frame RF. In other words, the rigid frame RF is connected to terminals of the flexible core 124. In some embodiments, the flexible core 124 is further extended into the rigid frame RF. In addition, similar to the rigid structures 122, the rigid frame RF may have a stack of rigid layers (not shown) and an interconnection structure (not shown) formed in the rigid layers. The interconnection structure in the rigid frame RF may be electrically connected with the interconnection structure IS in the rigid structures 122 through the circuit layer 126 (not shown) formed on the flexible core 124. In some embodiments, the rigid frame RF is in a rectangular shape. In other embodiments, the rigid frame RF is in a circular shape or a polygonal shape. Those skilled in the art would adjust the shape of the rigid frame RF according to design requirements, the present disclosure is not limited thereto.

As shown in FIG. 6, a stacking structure including the package structure 100 and the rigid-flexible substrate 220 may not be bonded to a package substrate (e.g., the package substrate 150 as shown in FIG. 2F). As such, signals transmitted between the semiconductor dies 102 may travel through the redistribution layer 106, interconnection structures IS in the rigid structures 122 and the circuit layer 126 formed on the flexible core 124, but may not travel through a package substrate. Therefore, a signal path is shorten, and insertion loss and return loss due to multiple connecting interface (e.g., the interface between the package substrate and the rigid structure 122) may be reduced.

Figure 7:
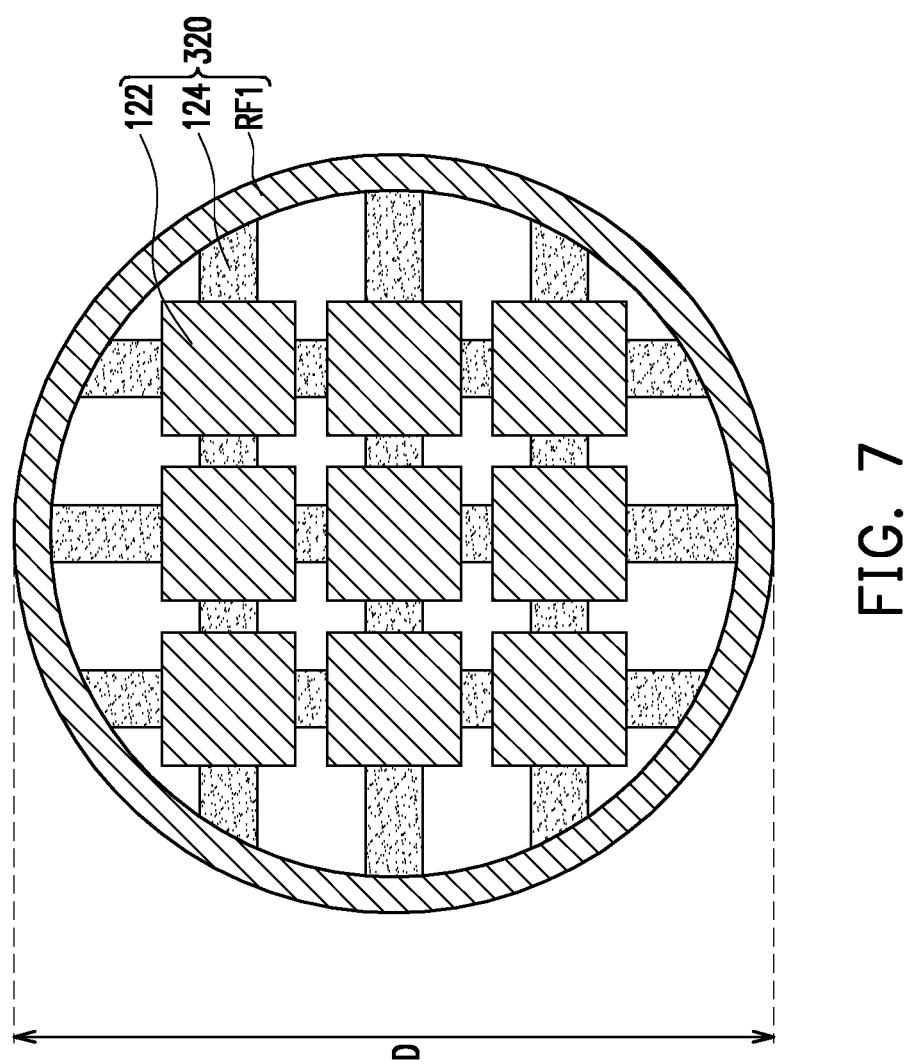
FIG. 7 is a top view of a rigid-flexible substrate according to some embodiments of the present disclosure.

FIG. 7 is a top view of a rigid-flexible substrate 320 according to some embodiments of the present disclosure.

Referring to FIG. 6 and FIG. 7, the rigid-flexible substrate 320 shown in FIG. 7 is similar to the rigid-flexible substrate 220 shown in FIG. 6. Only the difference therebetween will be discussed, the same or similar parts will be omitted for clarity. In addition, it should be note that some elements including the circuit layer 126, the protection layer 128 and the passivation layer 130 are omitted in FIG. 7. As shown in FIG. 7, a rigid frame RF1 of the rigid-flexible substrate 320 is formed in a circular shape. In some embodiments, a diameter of the circular rigid frame RF may range from 30 mm to 600 mm.

Figure 8:
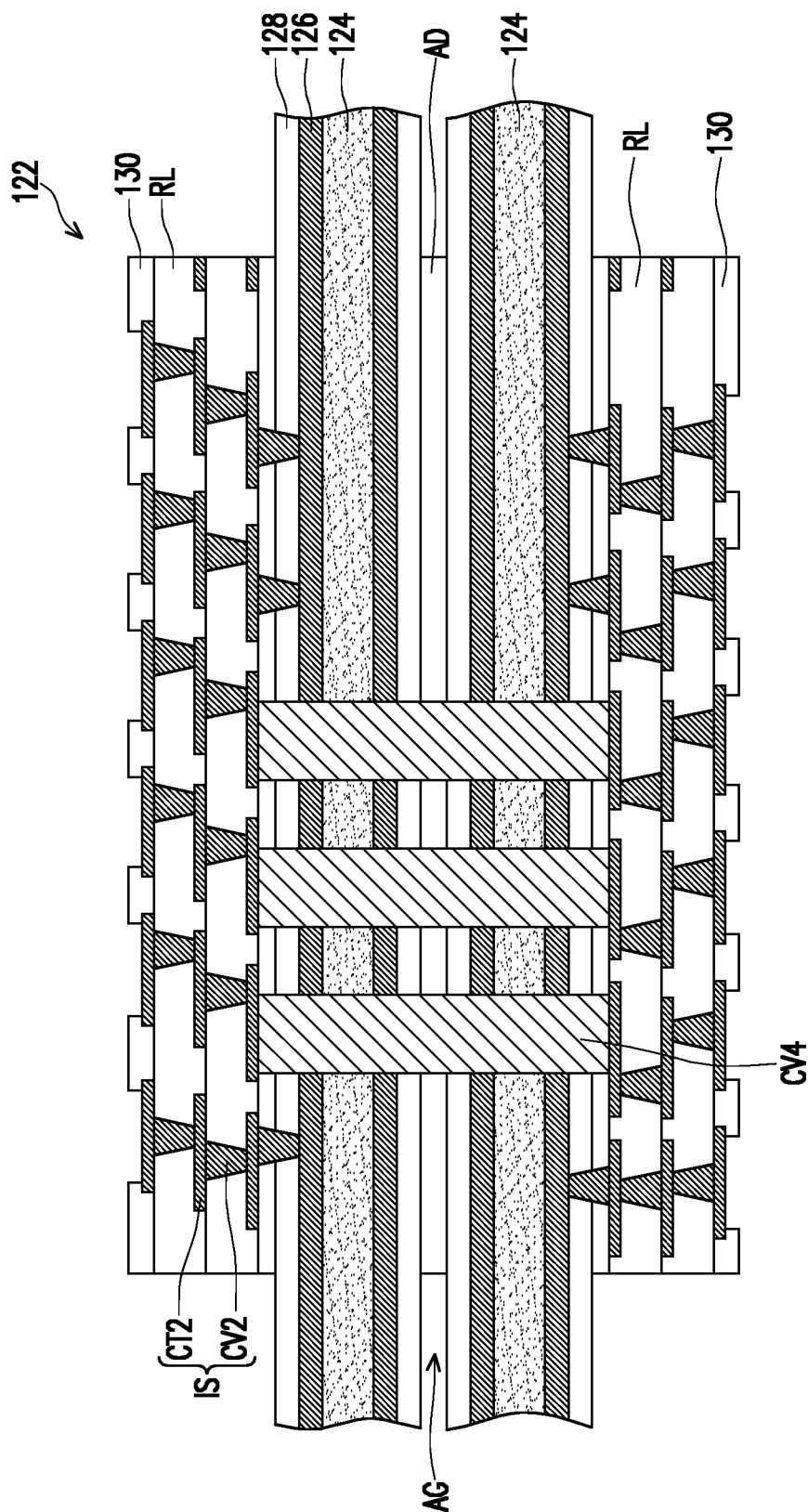
FIG. 8 is a cross-sectional view of a rigid structure and flexible cores according to some embodiments of the present disclosure.

FIG. 8 is a cross-sectional view of a rigid structure 122 and flexible cores 124 according to some embodiments of the present disclosure.

Referring to FIG. 2F and FIG. 8, the rigid structure 122 and the flexible core 124 shown in FIG. 8 is similar to the rigid structure 122 and flexible core 124 shown in FIG. 2F. Only the difference therebetween will be discussed, the same or similar parts will be omitted for clarity. As shown in FIG. 8, the rigid structure 122 is laterally penetrated by multiple flexible cores 124 (e.g., two flexible cores 124). The flexible cores 124 are vertically adjacent with one another. In some embodiments, the flexible cores 124 in the rigid structure 122 are located between vertically adjacent portions of the interconnection structure IS in the same rigid structure 122. Conductive vias CV4 are formed to vertically penetrate the flexible cores 124 in the rigid structures 122. The conductive via CV4 is electrically connected between the vertically adjacent portions of the interconnection structure IS in the rigid structure 122. In addition, an adhesion layer AD is formed between vertically adjacent flexible cores 124 in the rigid structure 122. In some embodiments, a material of the adhesion layer AD includes acrylic glue, epoxy resin or the like. Moreover, in some embodiments, an air gap AG is existed between vertically adjacent flexible cores 124 in a vicinity between laterally adjacent rigid structures 122.

As above, the rigid-flexible substrate is partially in contact with the package structure in the semiconductor package structure of the present disclosure. Specifically, the rigid structures are separately in contact with the package structure, whereas sections of the flexible core connected between laterally adjacent rigid structures are not in physical contact with the package structure. As compared to a substrate completely in contact with the package structure, each rigid structure of the present disclosure may have a shorter maximum distance to neutral point (DNP). Accordingly, maximum strain on the electrical connector located on the rigid structures may be reduced. In addition, the strain on the rigid structures induced by, for example, coefficient of thermal expansion (CTE) difference between the package structure and the rigid structures may be released at the vicinity between laterally adjacent rigid structures. Therefore, reliability of the semiconductor package structure may be improved, and this improvement is particularly significant when the package structure contains plenty of semiconductor dies as for super-HPC applications. In some embodiments, the semiconductor package structure may not include a package substrate. In these embodiments, signals transmitted between the semiconductor dies are conducted by the redistribution layer and the rigid-flexible substrate, but not travel through a package substrate. Therefore, a signal path is shorten, and insertion loss and return loss due to multiple connecting interface may be reduced.

In an aspect of the present disclosure, a manufacturing method of a semiconductor package is provided. The method comprises: providing an initial rigid-flexible substrate, wherein the initial rigid-flexible substrate comprises rigid structures and a flexible core laterally penetrating through the rigid structures, and further comprises a supporting frame connected to the rigid structures; bonding a package structure onto the initial rigid-flexible substrate, wherein the package structure comprises semiconductor dies and an encapsulant laterally surrounding the semiconductor dies; and removing the supporting frame.

In another aspect of the present disclosure, a manufacturing method of a semiconductor package is provided. The method comprises: laterally encapsulating semiconductor dies by an encapsulant; forming a redistribution layer at a side of a structure including the semiconductor dies and the encapsulant; providing an initial rigid-flexible substrate, wherein the initial rigid-flexible substrate comprises rigid structures and a flexible core laterally penetrating through the rigid structures, and further comprises a supporting frame laterally surrounding and connected to the rigid structures; bonding the initial rigid-flexible substrate with the redistribution layer, wherein a package structure comprising the semiconductor dies, the encapsulant and the redistribution layer is positioned that the semiconductor dies are respectively overlapped with one of the rigid structures during the bonding; and removing the supporting frame.

In yet another aspect of the present disclosure, a manufacturing method of a semiconductor package is provided. The method comprises: providing a rigid-flexible substrate, wherein the rigid-flexible substrate comprises rigid structures, a rigid frame and a flexible core, the rigid structures are laterally spaced apart from one another, the rigid frame laterally surrounds the rigid structures and separates from the rigid structures, the flexible core laterally penetrates through the rigid structures to connect the rigid structures, and extends to the rigid frame to connect the rigid frame with the rigid structures; and bonding a package structure onto the rigid-flexible substrate, wherein the package structure comprises semiconductor dies and an encapsulant laterally surrounding the semiconductor dies.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of a semiconductor package structure, comprising:
    providing an initial rigid-flexible substrate, wherein the initial rigid-flexible substrate comprises rigid structures and a flexible core laterally penetrating through the rigid structures, and further comprises a supporting frame connected to the rigid structures, wherein the flexible core has first segments and second segments intersected with the first segments, an array of openings are enclosed by the first segments and the second segments, and the rigid structures are each positioned at an intersection of one of the first segments and one of the second segments;
    bonding a package structure onto the initial rigid-flexible substrate, wherein the package structure comprises semiconductor dies and an encapsulant laterally surrounding the semiconductor dies; and
    removing the supporting frame.

2. The manufacturing method of the semiconductor package according to claim 1, wherein the rigid structures are laterally spaced apart from one another, and are connected by the flexible core.

3. The manufacturing method of the semiconductor package according to claim 1, wherein the initial rigid-flexible substrate is flexible between the rigid structures while being rigid at the rigid structures.

4. The manufacturing method of the semiconductor package according to claim 1, wherein portions of the initial rigid-flexible substrate between the rigid structures have a thickness less than a thickness of the initial rigid-flexible substrate at the rigid structures.

5. The manufacturing method of the semiconductor package according to claim 1, wherein each of the rigid structures has portions at opposite sides of the flexible core.

6. The manufacturing method of the semiconductor package according to claim 1, wherein the supporting frame laterally surrounds the rigid structures and the flexible core.

7. The manufacturing method of the semiconductor package according to claim 6, wherein the supporting frame are connected to peripheral ones of the rigid structures via supporting bars.

8. The manufacturing method of the semiconductor package according to claim 7, wherein the initial rigid-flexible substrate further comprises additional supporting bars respectively bridging adjacent ones of the rigid structures.

9. The manufacturing method of the semiconductor package according to claim 8, wherein the supporting bars and the additional supporting bars are removed during removal of the supporting frame.

10. The manufacturing method of the semiconductor package according to claim 1, wherein the rigid structures respectively comprise a stack of rigid layers as well as conductive traces and conductive vias spreading in the stack of rigid layers.

11. The manufacturing method of the semiconductor package according to claim 1, wherein the semiconductor dies in the package structure are respectively attached to one of the rigid structures while the package structure is bonded to the initial rigid-flexible substrate.

12. A manufacturing method of a semiconductor package, comprising:
    laterally encapsulating semiconductor dies by an encapsulant;
    forming a redistribution layer at a side of a structure including the semiconductor dies and the encapsulant;
    providing an initial rigid-flexible substrate, wherein the initial rigid-flexible substrate comprises rigid structures and a flexible core laterally penetrating through the rigid structures, and further comprises a supporting frame laterally enclosing the rigid structures and laterally connected to sidewalls of peripheral ones of the rigid structures;
    bonding the initial rigid-flexible substrate with the redistribution layer, wherein a package structure comprising the semiconductor dies, the encapsulant and the redistribution layer is positioned that the semiconductor dies are respectively overlapped with one of the rigid structures during the bonding; and
    removing the supporting frame.

13. The manufacturing method of the semiconductor package according to claim 12, further comprising:
    bonding a system input/output (I/O) structure on one of the rigid structures.

14. The manufacturing method of the semiconductor package according to claim 13, wherein the one of the rigid structures is overlapped with the system I/O structure and one of the semiconductor dies.

15. The manufacturing method of the semiconductor package according to claim 12, further comprising:
    bonding the rigid structures with a package substrate, wherein the package substrate and the package structure are located at opposite sides of the rigid structures; and
    bonding a system I/O structure on the package substrate.

16. The manufacturing method of the semiconductor package according to claim 15, wherein the system I/O structure is laterally spaced apart from the rigid structures and the package structure.

17. The manufacturing method of the semiconductor package according to claim 12, wherein a system I/O structure is laterally encapsulated by the encapsulant, along with the semiconductor dies.

18. A manufacturing method of a semiconductor package, comprising:
    providing a rigid-flexible substrate, wherein the rigid-flexible substrate comprises rigid structures, a rigid frame and a flexible core, the rigid structures are laterally spaced apart from one another, the rigid frame laterally surrounds the rigid structures and separates from the rigid structures, the flexible core laterally penetrates through the rigid structures and extends to the rigid frame to connect the rigid frame with the rigid structures, the flexible core has first segments and second segments intersected with the first segments, an array of openings are enclosed by the first and second segments, and the rigid structures are each positioned at an intersection of one of the first segments and one of the second segments; and bonding a package structure onto the rigid-flexible substrate, wherein the package structure comprises semiconductor dies and an encapsulant laterally surrounding the semiconductor dies.

19. The manufacturing method of the semiconductor package according to claim 18, wherein the rigid-flexible substrate is flexible between the rigid structures, and between the rigid frame and the rigid structures.

20. The manufacturing method of the semiconductor package according to claim 18, wherein portions of the rigid-flexible substrate between the rigid structures and portions of the rigid-flexible substrate between the rigid frame and the rigid structures have a thickness less than a thickness of the rigid-flexible substrate at the rigid structures and the rigid frame.

* * * * *